United States Patent
Morito et al.

(10) Patent No.: US 7,859,746 B2
(45) Date of Patent: Dec. 28, 2010

(54) SEMICONDUCTOR OPTICAL AMPLIFIER

(75) Inventors: Ken Morito, Kawasaki (JP); Susumu Yamazaki, Kawasaki (JP); Shinsuke Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 102 days.

(21) Appl. No.: 12/191,418

(22) Filed: Aug. 14, 2008

(65) Prior Publication Data

US 2009/0122393 A1    May 14, 2009

Related U.S. Application Data

(63) Continuation of application No. PCT/JP2006/302711, filed on Feb. 16, 2006.

(51) Int. Cl.
*H01S 5/343* (2006.01)
(52) U.S. Cl. .................................... 359/344
(58) Field of Classification Search ............ 359/344
See application file for complete search history.

(56) References Cited

U.S. PATENT DOCUMENTS

| | | | | |
|---|---|---|---|---|
| 5,939,733 | A * | 8/1999 | Sato ............................ | 257/94 |
| 6,487,007 | B1 | 11/2002 | Morito | |
| 2001/0006840 | A1* | 7/2001 | Takahashi .................... | 438/483 |
| 2001/0030319 | A1* | 10/2001 | Sato et al. .................... | 257/14 |
| 2001/0043390 | A1* | 11/2001 | Kim et al. .................... | 359/344 |
| 2001/0048111 | A1* | 12/2001 | Mukaihara et al. ............ | 257/79 |
| 2002/0179929 | A1* | 12/2002 | Takahashi et al. ........... | 257/184 |
| 2005/0111079 | A1* | 5/2005 | Wang et al. .................. | 359/344 |
| 2008/0310012 | A1* | 12/2008 | Tanaka et al. ............... | 359/344 |

FOREIGN PATENT DOCUMENTS

| | | |
|---|---|---|
| JP | 2000-252588 A | 9/2000 |
| JP | 2001-53392 A | 2/2001 |
| JP | 2004-119814 A | 4/2004 |
| JP | 2004-281656 A | 10/2004 |

OTHER PUBLICATIONS

Notification of Transmittal of Translation of the International Preliminary Report on Patentability (Form PCT/IB/338) of International Application No. PCT/JP2006/302711 mailed Aug. 28, 2008 with Forms PCT/IB/373 and PCT/ISA/237.
International Search Report of PCT/JP2006/302711, date of mailing Mar. 7, 2006.

* cited by examiner

*Primary Examiner*—Mark Hellner
*Assistant Examiner*—Ari M Diacou
(74) *Attorney, Agent, or Firm*—Fujitsu Patent Center

(57) ABSTRACT

A polarization-independent SOA is provided which uses an InP substrate (11) as a semiconductor substrate and uses GaInNAs having introduced tensile strain as an active layer (14). With this configuration, the polarization independence is achieved by introducing the tensile strain, and high saturation optical output power is realized by reducing the film thickness of the active layer (14) as well as the gain peak wavelength is increased by reducing the band gap of the active layer (14) through use of GaInNAs made by adding nitrogen (N) to GaInAs as a material of the active layer (14) so as to achieve high gain especially in C-band and L-band even when band filling exits at the time of injecting a high current into the active layer (14).

9 Claims, 5 Drawing Sheets

SEMICONDUCTOR OPTICAL AMPLIFIER

BACKGROUND

1. Field

The present invention relates to a high saturation optical output power.

2. Description of the Related Art

To cope with a drastic increase in communication needs in recent years, a so-called wavelength division multiplexing (WDM) system is progressively introduced which enables a large capacity transmission with one optical fiber by multiplexing a plurality of signal lights with different wavelengths. In this WDM system, the optical power of an optical signal attenuates due to a loss in each of optical components used for multiplexing and demultiplexing optical signals with different wavelengths, and therefore use of an optical amplifier is necessary to compensate the attenuation.

A semiconductor optical amplifier (SOA) is expected as an optical amplifier for compensating the loss of the WDM system because it is small in size and can be designed to obtain a gain in a wide wavelength range.

Since an optical fiber used in a general communication system has no polarization mode for an optical signal, the SOA needs to have an inter-polarization gain difference suppressed to a low value. The SOA also needs to be used in a linear region with the saturation optical output power being sufficiently increased because it causes, when used in a saturation region, a transmission penalty due to deterioration in waveform and crosstalk between wavelength channels caused by the pattern effect.

As an SOA realizing such a low polarization dependent gain and high saturation optical output power at the same time, an SOA using a GaInAs bulk structure with an added tensile strain as an active layer is disclosed in Japanese Patent Application Laid-open No. 2001-53392. Here, using a later structure of a GaInAs bulk active layer having a film thickness of 50 nm sandwiched at its both sides between light confinement layers each having a film thickness of 100 nm, and introducing a strain of −0.25% (in other words, a tensile strain of 0.25%) into the active layer when the active layer width is 1.4 μm, whereby a semiconductor optical amplifier is realized which has a fiber to fiber gain of 19 dB, a polarization dependent gain of 0.2 dB or less, and a fiber coupled saturation optical output power of +17 dB to a signal light having a wavelength of 1550 nm with an element of 1200 μm with an injection current of 500 mA.

In the above-described SOA in Japanese Patent Application Laid-open No. 2001-53392, the active layer is thinned to intend an increase in the saturation optical output power and to aim an increase in the mode cross-section area. However, when the active layer is thinned, the flatness of the active layer cross section is increased to cause a large difference in light confinement factor between polarizations, and therefore a tensile strain is added to the active layer for the purpose of canceling the difference so as to suppress the polarization dependent gain to low.

In this SOA, however, the introduction of the tensile strain into the active layer can suppress the polarization dependent gain to low but brings about a problem of the gain peak wavelength reducing in wavelength. Further, in this case, it is necessary to decrease the film thickness of the active layer in order to achieve the high saturation optical output power, thereby causing a reduction in wavelength of the gain peak wavelength to appear more prominently due to the band filling effect caused by an increase in carrier density.

FIG. 1 shows the injection current dependence of the gain peak wavelength in the SOA using the conventional GaInAs bulk structure for the active layer.

As shown in the diagram, an increase in the injection current into the active layer causes a reduction in the gain peak wavelength due to the band filling effect, the gain peak wavelength shifting to the short wavelength side up to 1455 nm at a current of 500 mA.

FIG. 2 shows the wavelength dependence of the fiber to fiber gain in the SOA using the conventional GaInAs bulk structure for the active layer.

Since C-band (a wavelength of 1530 nm to 1560 nm) and L-band (a wavelength of 1570 nm to 1610 nm) that are wavelength bands used in a standard WDM system are located on a long wavelength side of the gain peak wavelength, the gain substantially lowers on the long wavelength side. In particular, the gain is 28 dB at a wavelength of 1460 nm, whereas the gain is 16.5 dB at a wavelength of 1560 nm and the gain is 8.5 dB at a wavelength of 1610 nm.

Thus, a problem is to satisfy both polarization independence and high saturation optical output power of the SOA as well as to obtain a high gain in C-band and L-band used in an optical fiber communication system, especially in L-band.

SUMMARY

According to an aspect of the invention, a semiconductor optical amplifier includes: a semiconductor substrate; and an active layer provided above the semiconductor substrate, the amplifier amplifying an incident signal light incident on a light incident end surface by suppressing resonance of light due to reflection on the light incident end surface and on a light emission end surface of the active layer, and emitting the amplified light as an emission signal light from the light emission end surface in which a gain that the emission signal light obtains is constant independent of a polarization state of the incident signal light, wherein the semiconductor substrate is made of InP as a material, and wherein the active layer is made of GaInNAs as a material having a tensile strain introduced thereinto.

DETAILED DESCRIPTION OF THE EMBODIMENTS

The present invention provides a polarization-independent SOA using an InP substrate as a semiconductor substrate and using GaInNAs having introduced tensile strain as an active layer.

With the above-described configuration, the polarization independence is achieved by introducing the tensile strain, and the high saturation optical output power is realized by reducing the film thickness of the active layer as well as the gain peak wavelength is increased by reducing the band gap of the active layer through use of GaInNAs made by adding nitrogen (N) to GaInAs as a material of the active layer so as to achieve high gain especially in C-band and L-band even when band filling exits at the time of injecting a high current into the active layer.

As described above, since the flatness of the active layer cross section is high in the SOA with high saturation optical output power, a light confinement factor ($\Gamma_{TE}$) to the polarized light in the TE mode (TE polarized light) is larger than a light confinement factor ($\Gamma_{TM}$) to the TM polarized light. To achieve the polarization independence by this structure, a tensile strain is introduced into the active layer to make a material gain ($g_{TM}$) to the TM polarized light larger than a material gain ($g_{TE}$) to the TE polarized light for adjustment to establish $$\Gamma_{TE}g_{TE} = \Gamma_{TM}g_{TM}$$

To "introduce the tensile strain into the active layer" here, the Ga composition ratio and the In composition ratio in a GaInNAs crystal constituting the active layer can be adjusted to make its lattice constant to be smaller than the lattice constant of the InP substrate to create a state in which the GaInNAs crystal is stretched within a plane.

Figure 1:
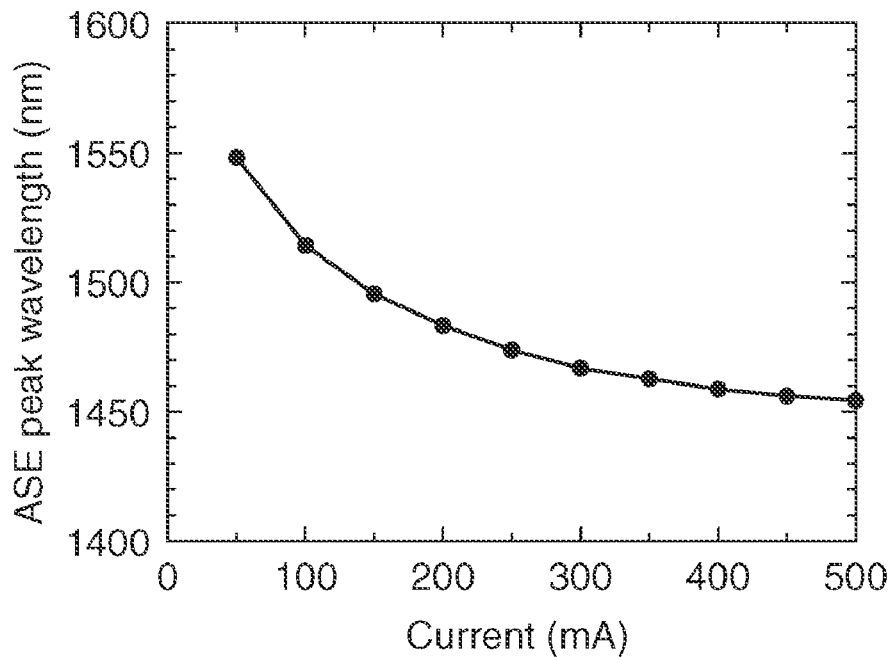
FIG. 1 is a characteristic diagram showing the injection current dependence of the gain peak wavelength in the SOA using the conventional GaInAs bulk structure for the active layer.
Figure 2:
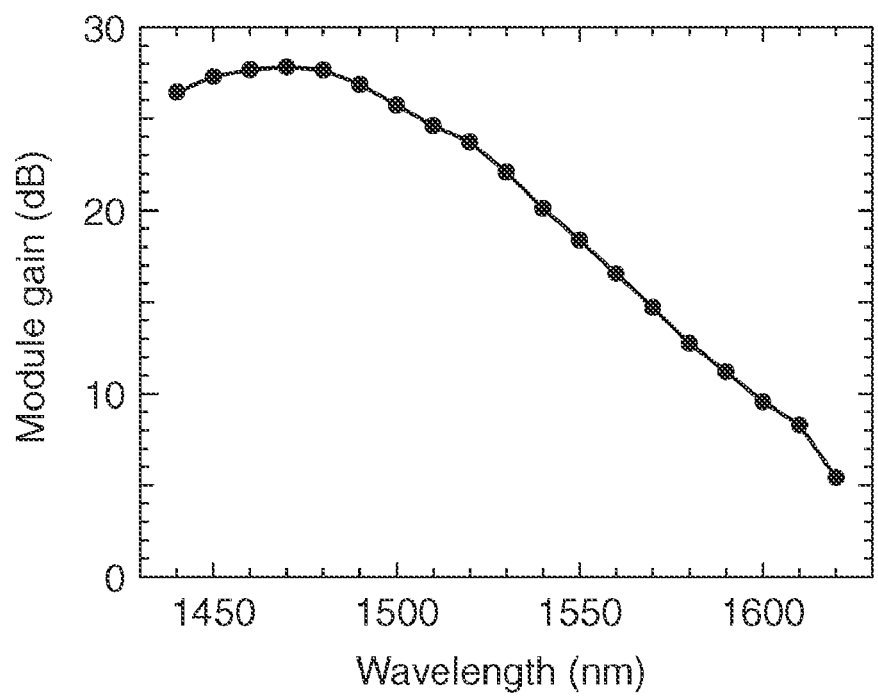
FIG. 2 is a characteristic diagram showing the wavelength dependence of the fiber to fiber gain in the SOA using the conventional GaInAs bulk structure for the active layer.
Figure 3:
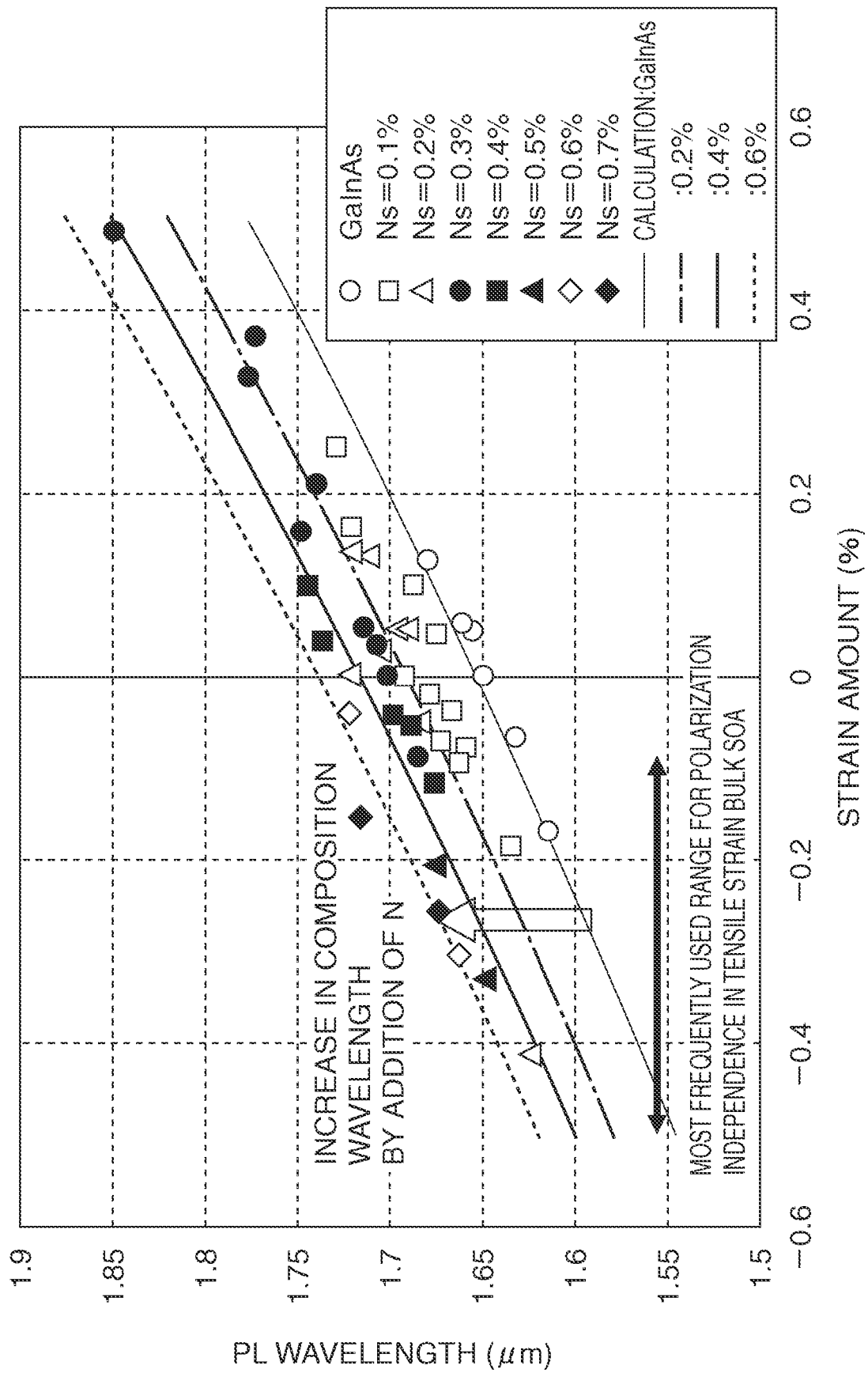
FIG. 3 is a characteristic diagram showing the measurement result of investigation of the strain amount dependence of a photoluminescence (PL) wavelength when the nitrogen composition (Ns) of GaInNAs grown on an InP substrate is changed.

FIG. 3 shows the measurement result of investigation of the strain amount dependence of a photoluminescence (PL) wavelength when the nitrogen composition (N) of GaInNAs grown on an InP substrate is changed. For reference, data on GaInAs is also shown. Here, the tensile strain is expressed with minus, while the compressive strain is expressed by plus.

For the bulk structure, in the conventional SOA using GaInAs for the active layer, a tensile strain of 0.1% to 0.5% is added to the active layer to achieve the polarization independence, in which the PL wavelength is reduced by about 20 nm for a tensile strain amount of 0.1% as compared to 1650 nm for no strain (0%) and by about 100 nm for a tensile strain amount of 0.5%. On the other hand, in the SOA of the present invention using GaInNAs for the active layer, the PL wavelength maintains 1650 nm when the nitrogen composition ratio is set to about 0.1% for a tensile strain amount of 0.1%. Beside, the PL wavelength maintains 1650 nm when the nitrogen composition ratio is set to about 0.8% for a tensile strain amount of 0.5%.

Further, since $g_{TE}$ increases due to the quantum effect in the quantum well structure, a tensile strain may be introduced up to about 1.5% for polarization independence, and therefore the PL wavelength is further reduced. In this case, it is difficult to maintain the PL wavelength of 1650 nm when the nitrogen composition ratio is about 0.8%, but the PL wavelength exhibits an increase in the PL wavelength of about 100 nm as compared to GaInAs, thereby presenting a sufficient effect to increase the gain.

In the present invention, the layer thickness of the active layer is decreased to realize the high saturation optical output power as described above. The layer thickness of the active layer here means the thickness of the active layer itself for the bulk structure, showing the total thickness if there are a plurality of active layers. On the other hand, the layer thickness means the total thickness of a plurality of quantum well layers (also including a quantum barrier when contributing to induced emission) for the multiple quantum well structure, and means the total thickness of a plurality of quantum dots for the quantum dot structure. Specifically, the film thickness is set to a value ranging from not less than 10 nm to not more than 100 nm. It is difficult here to realize the high saturation optical output power if the film thickness is larger than 100 nm, while it cannot to neglect a reduction in gain if the film thickness is less than 10 nm.

In addition, from the above-described measurement result, the nitrogen composition ratio to the whole GaInNAs is adjusted to a value ranging from not less than 0.1% to not more than 0.8%, and the tensile strain amount is adjusted to a value ranging from not less than 0.1% to not more than 1.5% in the present invention. In this case, the tensile strain amount corresponds to the In composition ratio in GaInNAs (the percentage of x where $Ga_{1-x}In_xNAs$, $0 \leq x \leq 1$), and therefore it is only required to adjust the In composition ratio to 0.54 to obtain a tensile strain amount of 0.1% at the nitrogen composition ratio of 0.8%, and adjust the In composition ratio to 0.32 to obtain a tensile strain amount of 1.5% at the nitrogen composition ratio of 0.1%. In short, the material of the active layer is set to $Ga_{1-x}In_xNAs$ where $0.32 \leq x \leq 0.54$ in the present invention.

If the tensile strain amount is larger than 1.5%, the sufficient increase in the PL wavelength is difficult, whereas if the tensile strain amount is less than 0.1%, the polarization independence is difficult. Beside, if the nitrogen composition ratio is larger than 0.8%, the crystal growth is difficult, whereas if the nitrogen composition ratio is less than 0.1, the sufficient increase in the PL wavelength is difficult.

Note that Japanese Patent Application Laid-open No. 2004-119814 discloses a laser device using InP for a substrate and GaInNAs for a well layer with the nitrogen concentration to the whole composition set to 0.5% to 2%. Further, Japanese Patent Application Laid-open No. 2000-252588 discloses a laser device using InP for the substrate and GaInNAs for the active layer with the nitrogen concentration to the whole composition set to not more than 0.5%.

However, the device arrangement of Japanese Patent Application Laid-open No. 2004-119814 is a "semiconductor layer device utilizing inter-subband transition" and the device arrangement of Japanese Patent Application Laid-open No. 2000-252588 is a "semiconductor laser device for gas analysis." In these semiconductor laser devices, the laser light is self-emitting light and therefore the polarization dependence is naturally eliminated from consideration. In contrast, the device arrangement of the present invention is a "polarization independent semiconductor optical amplifier" in which it is assumed to obtain the polarization independence, and it is therefore essential to introduce the tensile strain into the active layer.

In the present invention, GaInNAs with added nitrogen is used as the material of the active layer in order to suppress the blue-shift of the gain peak wavelength accompanying the introduction of the tensile strain as described above. If the tensile strain is introduced into the well layer or the active layer in the laser devices of Japanese Patent Application Laid-open Nos. 2004-119814 and 2000-252588, the gain peak wavelength is blue-shifted, resulting in direct opposition to the red-shift in gain peak wavelength that is the purpose of Japanese Patent Application Laid-open Nos. 2004-119814 and 2000-252588. Accordingly, the present invention is completely different in object and effect as well as in configuration, from the inventions of Japanese Patent Application Laid-open Nos. 2004-119814 and 2000-252588 simply for the purpose of red-shift in gain peak wavelength, and therefore the present invention is a different invention from them.

Hereinafter, concrete embodiments in which the present invention is applied to an SOA will be described in detail with reference to the drawings.

Figure 4:
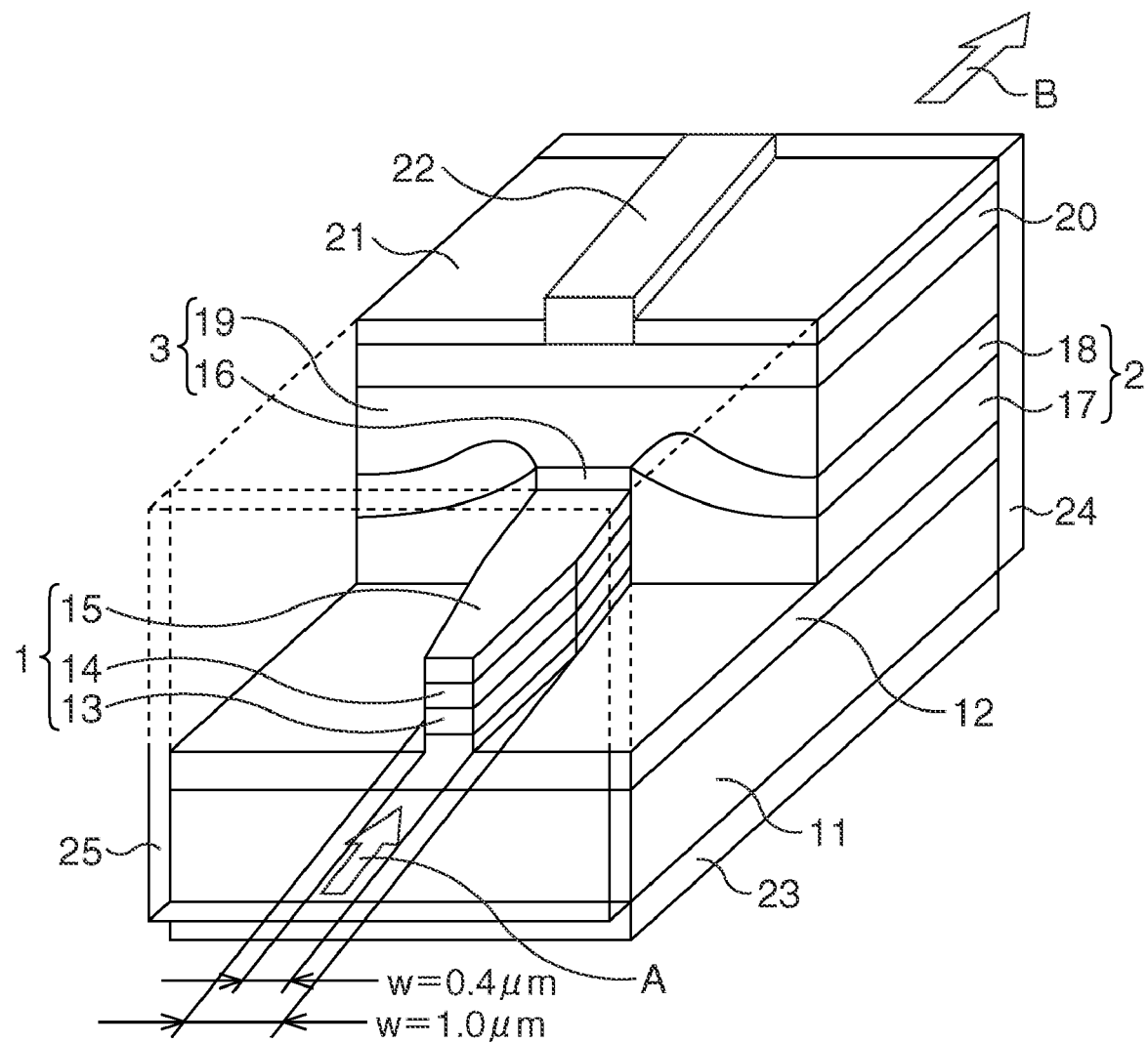
FIG. 4 is a partially cut perspective view showing a schematic configuration of an SOA according to an embodiment of the present invention.

FIG. 4 is a partially cut perspective view showing a schematic configuration of an SOA according to this embodiment. In this drawing, illustration of a p-type InP current block layer 17, an n-type InP current block layer 18, p-type InP clad layers 16 and 19, a p-type InGaAs contact layer 20, a silicon oxide film 21, and a p-type electrode 22 is omitted in the front half of the SOA to show the state of the active layer.

The SOA of this embodiment is a polarization-independent SOA, for example, in a substantially rectangular parallelepiped element shape with an element length of about 1000 μm and en element width of about 300 μm, having a light incident end surface on the side of an arrow A and a light emission end surface on the side of an arrow B, and is configured to amplify an incident signal light incident on the light incident end surface as shown by the arrow A and emit the amplified light as an emission signal light from the light emission end surface as shown by the arrow B such that the gain that the emission signal light obtains is constant independent of the polarization state of the incident signal light.

In this SOA, a spot-size converter 1 is provided which is patterned in a band shape above an n-type InP substrate 11 via an n-type InP buffer layer 12 also serving as a lower clad layer. Furthermore, a current confinement structure 2 is formed to bury the spot-size converter 1 from the side surfaces thereof, and an upper clad layer 3 and the p-type InGaAs contact layer 20 are layered in sequence to cover the upper surface of the spot-size converter 1 and the top of the current confinement structure 2. Moreover, the patterned p-type electrode 22 is provided on the p-type InGaAs contact layer 20 in a band shape to be parallel to the spot-size converter 1, and the silicon oxide film 21 is formed on the p-type InGaAs contact layer 20 to cover portions of the side surfaces of the p-type electrode 22. Further, an anti-reflective coating film 24 and an anti-reflective coating film 25 are provided on the light incident end surface and the light emission end surface, respectively, and the n-type electrode 23 is provided on the rear surface, thus constituting the SOA.

The spot-size converter 1 is configured such that the active layer 14 forming a path of the incident light (optical waveguide) is directly sandwiched between a pair of light confinement layers 13 and 15 made of InGaAsP. This spot-size converter 1 is patterned in a band shape having a width gradually decreasing from the middle region toward the light incident end surface and the light emission end surface (for example, the maximum width of about 1.0 μm and a minimum width of about 0.4 μm), and is thus formed in a state inclined at a predetermined angle, for example, about 7° with respect to a normal to the light emission end surface. The active layer 14 can be formed to have a tapered width as described above to increase the spot size of a propagating light so as to improve the optical coupling efficiency. Further, the optical waveguide formed in the inclined structure makes it possible to suppress the resonance on the end surfaces to thereby reduce the reflectance.

The active layer 14 is of a bulk structure using GaInNAs as a material having tensile strain introduced thereinto, and is formed about 50 nm in film thickness here. Note that it is also preferable to form this film thickness gradually smaller toward the light incident end surface in order to further improve the optical coupling efficiency.

The tensile strain introduced into GaInNAs is obtained by forming the active layer 14 with a Ga composition ratio and an In composition ratio adjusted so that the lattice constant of GaInNAs is smaller than the lattice constant of the n-type InP buffer layer 12. In this embodiment, the appropriate range of the value of the tensile strain amount is not less than 0.1% and not more than 1.5%, and the tensile strain amount is adjusted, for example, to 0.25% (that is, a strain amount of −0.25%). Accordingly, where GaInNAs used here is $Ga_{1-x}In_xNAs$, the appropriate range is $0.32 \leq x \leq 0.54$, and the In composition ratio (x) is adjusted here to 0.51 to correspond to the tensile strain of 0.25%. Further, the appropriate range of the composition ratio of nitrogen (N) to the whole GaInNAs is not less than 0.1% and not more than 0.8%, and the composition ratio is adjusted, for example, to 0.8%.

With the above-described configuration, the polarization independence is achieved by introducing the tensile strain into the active layer 14, and the high saturation optical output power is realized by reducing the film thickness of the active layer 14 as well as the gain peak wavelength is increased by reducing the band gap of the active layer 14 through use of GaInNAs made by adding nitrogen (N) to GaInAs as a material of the active layer 14 so as to achieve high gain especially in C-band and L-band even when band filling exits at the time of injecting a high current into the active layer 14.

A configuration may be employed here in which no active layer 14 exists in a region located at about 10 μm to about 50 μm from the light incident end surface and the light emission end surface and portions of the upper clad layer 3 are formed to cover the tip surfaces of the active layer 14. This configuration can suppress the amount of return light coupling with the spot-size converter 1 to further reduce the reflectance.

The current confinement structure 2 is composed of the p-type InP current block layer 17 and the n-type InP current block layer 18 layered in sequence. Beside, the upper clad layer 3 is composed of the p-type InP clad layer 16 covering the upper surface of the spot-size converter 1 and the p-type InP clad layer 19 covering the top of the p-type InP clad layer 16 and the top of the n-type InP current block layer 18.

In this polarization-independent semiconductor optical amplifier, the anti-reflective coating films 24 and 25 are provided on cleavage planes, that is, the light incident end surface and the light emission end surface, whereby resonance of light due to reflection between the light incident end surface and the light emission end surface is suppressed, so that the amplifier amplifies a signal input light, for example, near 1.55 μm in the active layer 14 by induced emission effect and emits the amplified output light from the light emission end surface.

Note that in the SOA according to this embodiment, the active layer 14 may be used as a functional layer of an amplifier, a phase adjuster, or the like of an optical function element integrated on the InP substrate 11.

For fabrication of the polarization-independent SOA with the above-described configuration, the n-type InP buffer layer 12 in a film thickness of, for example, about 300 nm, the light confinement layer 13 made of n-type InGaAsP as a material in a film thickness of, for example, about 100 nm with a composition of 1.2 μm, the bulk active layer 14 made of GaInNAs in a film thickness of, for example, about 50 nm with a strain amount of −0.25% and with a nitrogen composition ration of 0.8%, the light confinement layer 15 made of p-type InGaAsP as a material in a film thickness of, for example, about 100 nm with a composition of 1.2 μm, and the p-type InP clad layer 16 are first deposited in sequence on and above the n-type InP substrate 11 using the MOCVD (organic metal chemical vapor deposition) method.

Subsequently, a silicon oxide film is deposited on the entire surface and patterned in a stripe shape with a longitudinal axis inclined at 7° to 10°, for example, at about 7° with respect to the normal to the light emission end surface and with a width of 0.6 µm to 1.4 µm, for example, about 1.0 µm using a direct contact exposure method. Then, using this silicon oxide film mask (not shown) in the stripe shape, mesa etching is performed by the reactive ion etching (RIE) to reach the n-type InP buffer layer 12. This forms a mesa in the strip shape with an active layer width w of 0.6 µm to 1.4 µm, for example, about 1.0 µm.

In this case, the active layer 14 is made such that its width w is in a tapered shape gradually decreasing from about 1.0 µm to about 0.4 µm from the middle region towards the light incident end surface and the light emission end surface to thereby increase the optical coupling efficiency in the final element structure.

Subsequently, using the silicon oxide film mask as a selective growth mask as it is, the p-type InP current block layer 17 and the n-type InP current block layer 18 are selectively grown on the side walls of the mesa in the stripe shape.

Subsequently, the silicon oxide film mask is removed, and the p-type InP clad layer 19 and the p-type InGaAs contact layer 20 are deposited in sequence on the entire surface.

Subsequently, the silicon oxide film 21 is deposited on the entire surface, an opening is then formed which projectively overlaps the mesa in the stripe shape, and the p-type electrode 22 is formed and the n-type electrode 23 is formed on the rear surface of the n-type InP substrate 11.

Subsequently, after cleavage along the cleavage planes, the anti-reflective coating films 24 and 25 are deposited on the cleavage planes.

Through the above-described processes, the basic configuration of the polarization-independent SOA according to this embodiment is completed.

The SOA according to this embodiment fabricated as described above and a conventional SOA as its comparative object were used to measure the ASE spectrum with an injection current of 300 mA. The conventional SOA used here is one in a bulk structure having the active layer made of InGaAs as a material with a strain amount of −0.25% in a film thickness of about 50 nm.

Figure 5:
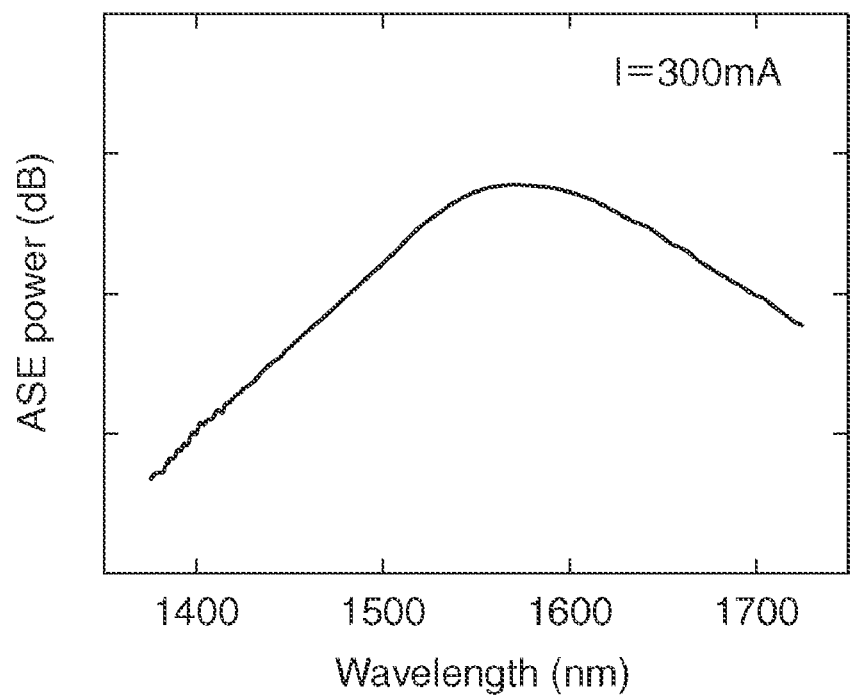
FIG. 5 is a characteristic diagram showing a result of measurement of AES spectrum when the injection current is 300 mA using the SOA according to this embodiment.
Figure 6:
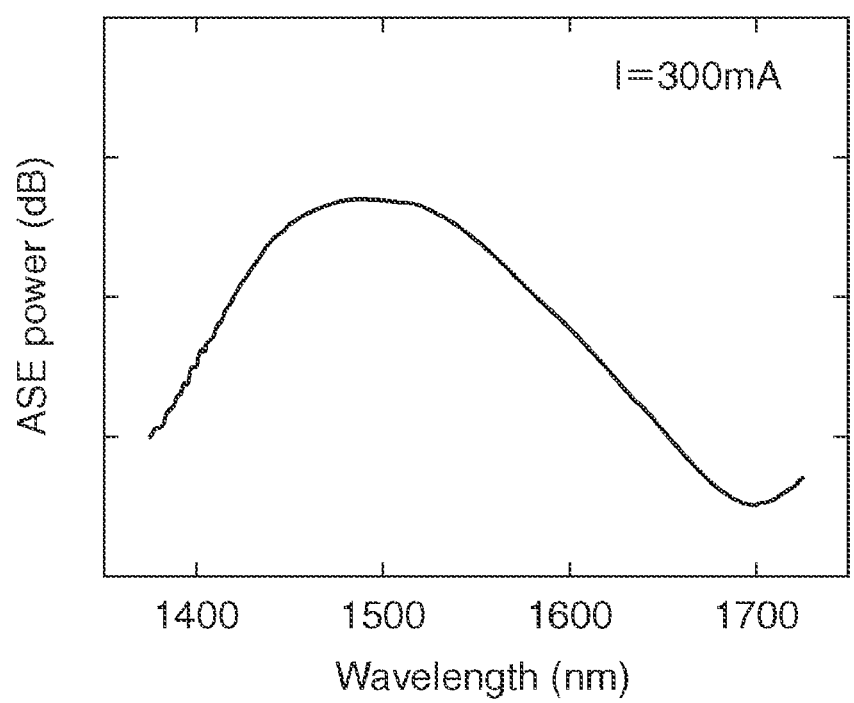
FIG. 6 is a characteristic diagram showing a result of measurement of AES spectrum when the injection current is 300 mA using a conventional SOA as a comparative object to FIG. 5.

The measurement result of the SOA according to this embodiment is shown in FIG. 5, and the measurement result of the conventional SOA is shown in FIG. 6.

As shown in the drawings, the peak wavelength in the conventional SOA is 1496 nm, whereas the SOA according to this embodiment is 1581 nm, showing an increase in wavelength of 85 nm.

Figure 7:
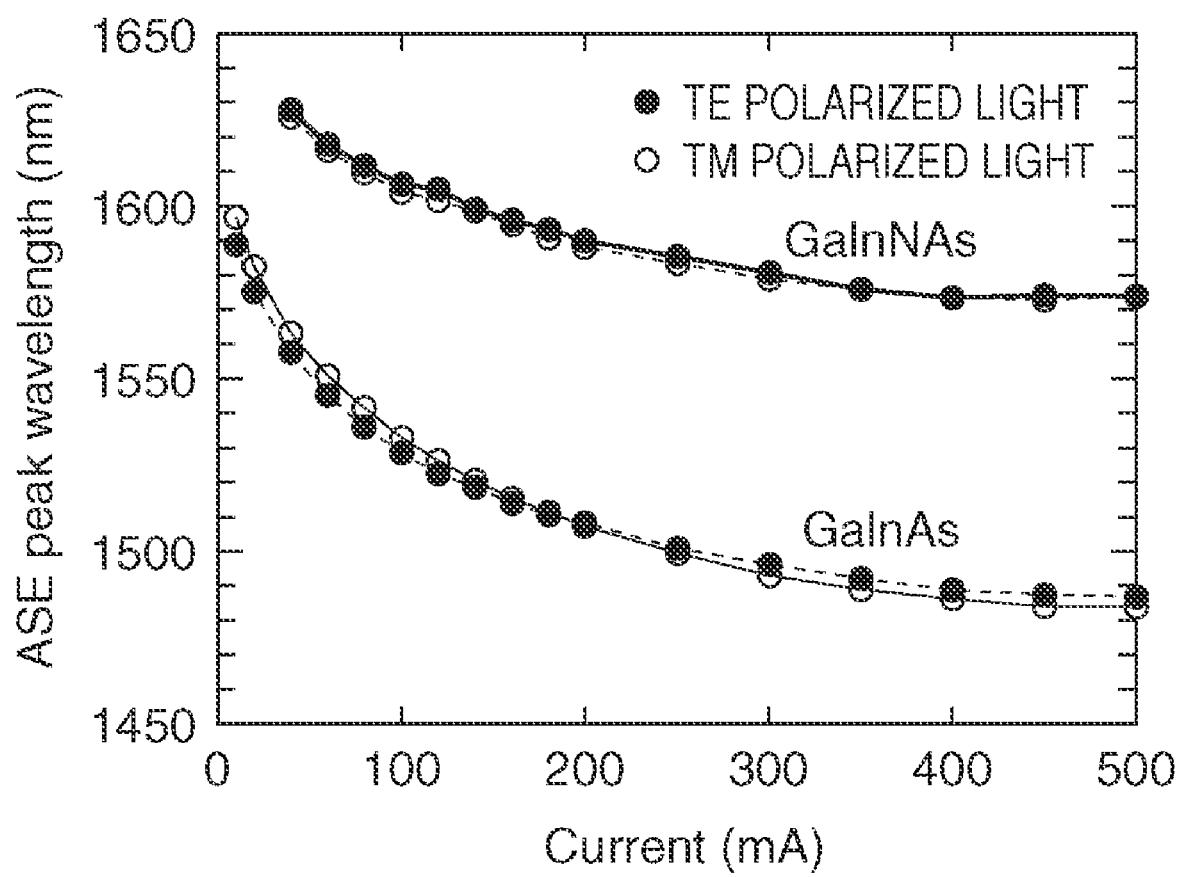
FIG. 7 is a characteristic diagram showing the results of measurement of the injection current dependence of the ASE peak wavelength for the SOA according to this embodiment and the conventional SOA.

Next, the injection current dependence of the ASE peak wavelength was evaluated for the SOA according to this embodiment and the conventional SOA. The measurement results are shown in FIG. 7.

As shown in the diagram, it is found that the SOA according to this embodiment exhibits ASE peak wavelengths longer than those of the conventional SOA at all times for all of the injection currents from 0 mA to 500 mA.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor optical amplifier, comprising:
   a semiconductor substrate; and
   an active layer formed over said semiconductor substrate, wherein said semiconductor substrate includes InP, and
   said active layer includes GaInNAs having a tensile strain introduced thereinto,
   wherein resonance of light due to reflection of an incident signal light incident on a light incident end surface and on a light emission end surface of said active layer is suppressed, and amplified light emitted as an emission signal light from the light emission end surface exhibits a gain that is constant independent of a polarization state of the incident signal light, and
   wherein said active layer has a composition ratio of N to GaInNAs as a whole has a value ranging from not less than about 0.1% to not more than about 0.8%; and
   wherein an amount of the tensile strain of said active layer has a value ranging from not less than about 0.1% to not more than about 1.5%.

2. The semiconductor optical amplifier according to claim 1,
   wherein said active layer has a film thickness having a value ranging from not less than 10 nm to not more than 100 nm.

3. The semiconductor optical amplifier according to claim 1, further comprising:
   a pair of clad layers holding top and bottom of said active layer therebetween.

4. The semiconductor optical amplifier according to claim 3,
   wherein a current confinement structure is formed in which a current block layer buries said active layer at a periphery thereof.

5. The semiconductor optical amplifier according to claim 3,
   wherein said clad layers are formed to cover tip surfaces of said active layer on the light incident end surface and on the light emission end surface.

6. The semiconductor optical amplifier according to claim 3, further comprising:
   a pair of light confinement layers directly holding top and bottom of said active layer therebetween, wherein said clad layers are provided via said light confinement layers.

7. The semiconductor optical amplifier according to claim 1,
   wherein said active layer is formed such that a width thereof gradually decreases from a middle region thereof toward the light incident end surface and the light emission end surface.

8. The semiconductor optical amplifier according to claim 1,
   wherein said active layer is formed such that a film thickness thereof gradually decreases from a middle region thereof toward the light incident end surface and the light emission end surface.

9. The semiconductor optical amplifier according to claim 1,
   wherein said active layer is formed at an angle inclined from a direction normal to a cleavage plane of said semiconductor substrate.

* * * * *